United States Patent [19]
Archer et al.

[11] B  3,990,058
[45]   Nov. 2, 1976

[54] MULTIPLE LOOP SHIFT REGISTER HAVING REDUNDANCY

[75] Inventors: John L. Archer, Orange; Leonard Tocci, Laguna Niguel; Thomas T. Chen, Yorba Linda, all of Calif.

[73] Assignee: Rockwell International Corporation, El Segundo, Calif.

[22] Filed: Aug. 22, 1974

[21] Appl. No.: 499,718

[44] Published under the second Trial Voluntary Protest Program on January 27, 1976 as document No. B 499,718.

[52] U.S. Cl. .......................................... 340/174 TF
[51] Int. Cl.² ................ G11C 29/00; G11C 11/14; G11C 19/00
[58] Field of Search................ 340/174 TF, 174 ED

[56] References Cited
UNITED STATES PATENTS
3,792,450    2/1974    Bogar et al.................. 340/174 TF

*Primary Examiner*—Vincent P. Canney
*Attorney, Agent, or Firm*—H. Fredrick Hamann; G. Donald Weber, Jr.

[57] ABSTRACT

A magnetic memory organization for single wall magnetic domains comprising a primary domain propagation loop, secondary propagation loops which may be serially coupled to the primary loop for enlarging the capacity of the primary loop, and a conductor network for altering the magnetic properties of the loops to connect operative secondary loops in series with the primary loop and to bypass inoperative secondary loops.

11 Claims, 3 Drawing Figures

MULTIPLE LOOP SHIFT REGISTER HAVING REDUNDANCY

BACKGROUND OF THE INVENTION

1. Field of the Invention

This invention relates to bubble domain memory devices and, more particularly, to a serial shift register arrangement incorporating multiple loops and redundancy.

2. Description of the Prior Art

Presently, bubble domain memory devices having serial first-in first-out (FIFO) organization are best implemented by the simple serial shift register. In order to decrease the cost and improve the reliability of a memory storage system based on the serial shift register, it is necessary to increase the capacity of each memory chip by increasing the chip size. Unfortunately, the processing yield decreases with increasing chip size.

Organizations which incorporate redundancy are logical alternatives to the simple serial shift organization. However, the existing organizations have shortcomings which offset or decrease any potential increase in processing yield attributable to redundancy. For example, major/minor loop organizations, on-chip decoding organizations and bi-polar or quadrature organizations all introduce blanks in the data stream or require additional logic and on-chip logic modifications to eliminate the data blanks. Also, each of these organizations results in considerably increased complexity in processing, which translates into reduced processing yield. Obviously, such organizations can be very costly.

As may be appreciated, it is desirable to provide a serial FIFO organization which realizes the potential increased yield of redundancy without problems such as degradation of reliability or performance.

SUMMARY OF THE INVENTION

The present invention relates to a magnetic domain organization for a serial shift register utilizing a layer of magnetic material in which single wall domains can be propagated. The organization comprises a patterned, magnetizable overlay arrangement which forms a primary domain propagation loop, secondary domain propagation loops, and alternative paths along which the secondary loops can be connected serially to, or excluded from, the primary loop. The organization also comprises a conductor overlay network which is used to program the organization, i.e., to connect or exclude the secondary loops. A serial shift register which utilizes the organization may be programmed by selectively coupling the secondary loops in series with the primary loop; testing the secondary loops; and, selectively degrading the magnetic properties of the paths via the conductor network to permanently connect operative secondary loops or bypass inoperative secondary loops.

DETAILED DESCRIPTION OF A PREFERRED EMBODIMENT

Figure 1:
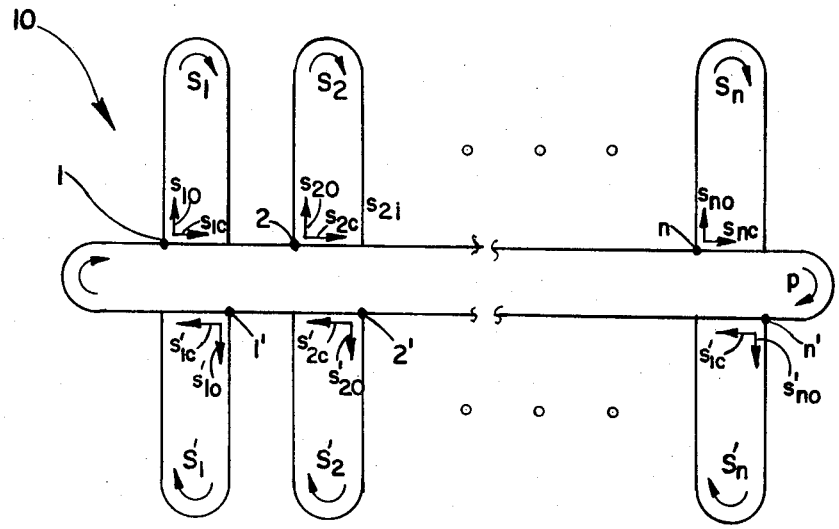
FIG. 1 is a schematic representation of the circuit paths, including alternative paths, available prior to programming in a serial shift register incorporating the principles of the present invention.

Referring now to FIG. 1, there is shown a schematic representation of a propagation pattern 10 useful as to a multiple loop serial shift register incorporating redundancy according to the principles of the present invention. As used here, "redundancy" refers to the availability of alternative propagation paths to a cylindrical single wall magnetic domain or "bubble" domain. Propagation pattern 10 includes a primary propagation path (primary loop) p, secondary propagation paths (secondary loops) $s_1, s_2, \ldots s_n$ located at one side of the primary loop, and secondary paths $s'_1, s'_2, \ldots s'_n$ located at the opposite side of the primary path. The arrangement of oppositely-positioned secondary paths is illustrative only. Other equally beneficial arrangements can, of course, be provided. Alternative paths are provided for bubble domains at junctions $1, 2, \ldots n$ and $1', 2', \ldots n'$ of the secondary paths with the primary path. That is, bubble domains propagating through pattern 10 can continue in path p or, alternatively, move into path $S_1$ through the appropriate junction.

Figure 2:
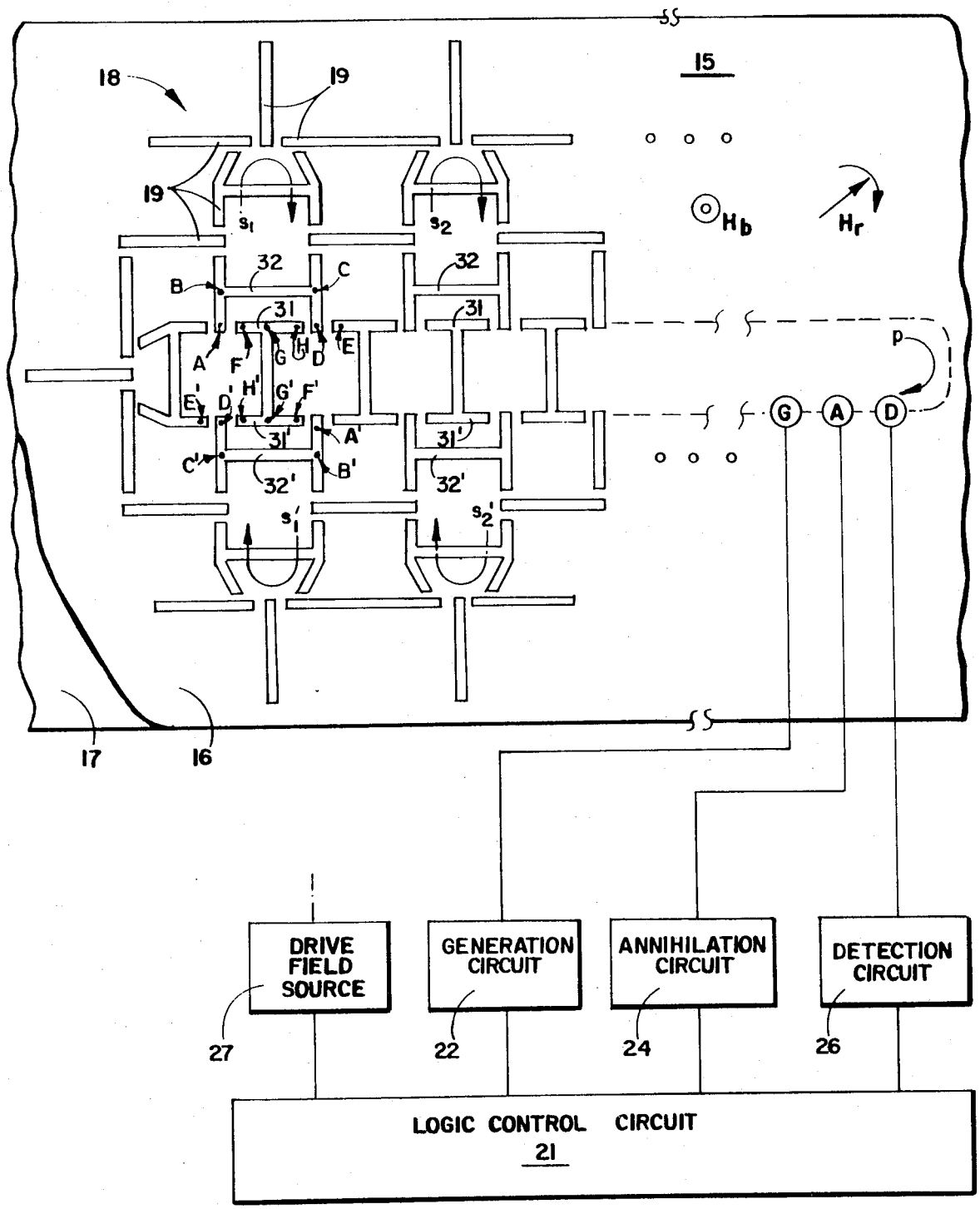
FIG. 2 is a plan view of a bubble domain chip, including a magnetic overlay arrangement which provides a primary and secondary propagation loops in accordance with the principles of the present invention.

Referring now to FIG. 2, there is shown a bubble domain chip 15, typically comprising a layer 16 of bubble domain material supported by a substrate 17 of non-bubble domain material. Typically, the bubble domain layer 16 may be in the form of a thin film of magnetic garnet material and the supporting substrate 17 may be of a non-magnetic garnet material.

The chip 15 includes a patterned overlay 18 of generally I-shaped and H-shaped elements 19 of a soft magnetic material such as permalloy. The elements 19 are used to form the primary path p and secondary paths $s_1$, $s'_1$, etc., for effecting the movement of domains (not shown) formed in the bubble domain material 16. By means of a network 20 (FIG. 3) of conducting paths which overlie the magnetic propagation elements, the secondary paths can be selectively eliminated from or incorporated into the memory storage provided by the primary path. Thus, a chip which incorporates the propagation pattern 10 or 18 can be used if one or more of the secondary loops is inoperative.

The bubble domains may be formed by several methods which are well known in the art. Illustratively, the domains may be generated by pulsing a current in the appropriate direction through a conductor over any one of several magnetic overlay patterns which are well known to one skilled in the art. A generator is illustrated generally by the symbol G adjacent path p. A magnetic bias field, $H_b$ is provided by a source (not shown), such as a permanent magnet. In a manner well known to one skilled in the art, a logic control circuit 21 controls the operation of generator circuitry 22 for supplying the requisite current pulses. The logic control circuit 21 also controls overlay patterns, illustrated by the symbols A and D, adjacent path P and their respective associated circuits, domain annihilator circuit 24 and domain detection circuit 26, for annihilating and detecting domains. Under the control of the logic circuit 21, magnetic field source 27 produces a rotating drive field, $H_r$, in the plane of the layer 16 for moving the domains along the propagation paths $p$, $s_1$, $s'_1$, etc., defined by the magnetic poles formed at soft magnetic elements 19.

Figure 3:
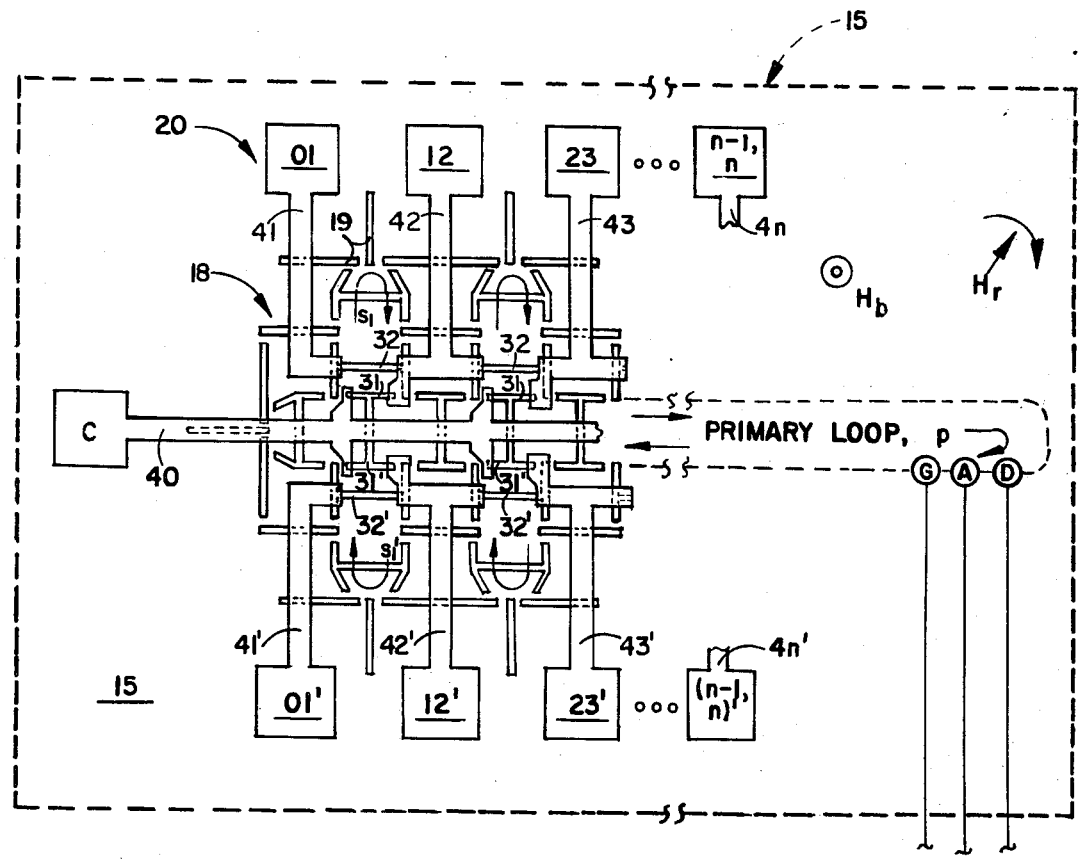
FIG. 3 is a plan view showing a network of programming conductors overlying the magnetic overlay of FIG. 2 in accordance with the principles of the present invention.

FIG. 3 shows a portion of the chip 15 shown in FIG. 2 and also shows the patterned conductor network 20. The conductor network 20 efficiently implements redundancy in the bubble domain memory chip 15 without the introduction of blanks in the data stream. Typically, the conductor network 20 overlies the soft magnetic overlay 18, and can be formed by well known processes such as a deposition-etch process. Using techniques well known in the art, the network 20 can be insulated from the overlay 18, e.g., by an intervening layer of material (not shown) such as $SiO_2$, except at points where electrical connections are made to certain portions 31, 31', 32 and 32' of the elements 19 which also serve as programming bars, as hereinafter described.

Referring to FIG. 1, the chip 15 is formed such that, before the conductor network 20 (FIG. 3) is utilized to program the chip, the patterned overlay 18 (FIG. 2) forms two alternative paths for the bubble domains at each of the junctions 1, 1', 2, 2', ... $n$, $n'$ of the respective secondary paths $s_1, s'_1, s_2, s'_2, \ldots s, _n, s'_n$ with the primary path $p$. The alternative paths are the primary path or the respective secondary paths. Then, those secondary paths which are determined to be operative, i.e., free of defects which render them inoperative, are inserted in series with the primary path $p$ along paths $s_{10}, s_{20}, \ldots s_{n0}$, and $s'_{10}, s'_{20}, \ldots s'_{n0}$. Defective secondary paths are bypassed along the alternative paths, which are portions of the primary path designated $s_{1c}, s_{2c}, \ldots s_{nc}, s'_{1c}, s'_2, \ldots s'_{nc}$. This arrangement increases the processing yield while increasing the capacity of the primary path. That is, capacity is increased by the addition of the respective secondary loops to the primary loop. Yield is increased inasmuch as the chip is retained as useful even if one or more secondary loops are defective.

Referring to FIG. 2, after forming the overlay 18 and network 20 (FIG. 3), the overlay may be programmed. That is, (1) a data stream in the form of propagating bubble domains is steered through each secondary path; (2) each secondary path is tested using the detector D in the primary path to compare the output data of each secondary path with the input data stream, and thereby differentiate between good and bad secondary paths; and (3) the conductor network 20 is used to selectively degrade the magnetic properties of selected ones of the individual magnetic elements to exclude defective secondary paths from, or incorporate secondary paths in series with, the primary path.

Referring to FIG. 3, the conductor network 20 which is used for steering and programming comprises a common conductor 40 which connects to the ends of the various element portions 31 and 31' at points F and H', respectively (FIG. 2). Electrical connection can be made to bar 40 via pad C. The conductor network 20 also comprises conductors 41, 42, 43, ... $4n$ and 41', 42', 43', ... $4n'$ to which electrical connections can be made via pads 01, 12, 23, ... $(n-1,n)$ and 01', 12', 23', ... $(n-1,n)'$, respectively. These conductors connect to opposite ends of element portion 32 or 32' at points B and C, or B' and C', respectively. Conductors 42, 43, ... $4n$ and 42', 43', ... $4n'$ also connect to element portions 31 and 31', respectively, at points H and F' (FIG. 2). As described more fully subsequently, adjacent conductors such as 41 and 42 or 41' and 42' are used in conjunction with common conductor 40 to steer and program secondary paths, such as $s_1$ and $s'_1$, respectively, located therebetween. For example, steering current pulses are applied to point F or F' to steer bubble domains pursuant to step (1) of the programming sequence, then programming pulses are applied across element portions 31 and 32 or 31' and 32' pursuant to step (3) to program the secondary paths.

According to the first step of the programming sequence, a data stream in the form of bubble domains is applied to the primary path $p$. The bubble domains are steered into each of the secondary paths as desired by applying a steering current pulse through the magnetic element portion 31 or 31' associated with each junction 1, 1', 2, 2', etc. (FIG. 1). As used here, a "steering current pulse" is a current pulse of appropriate polarity and sufficient magnitude across element portion 31 or 31' to repel domains from, or attract domains to, point F or F' without degrading the magnetic properties of the element portion. As an example, and referring to FIGS. 2 and 3, if secondary loop $s_1$ is to be tested, the bubble domain stream is diverted from the primary path p and into the secondary path $s_1$ by the application of a steering current pulse through conductor pads C and 12 (FIG. 3) and across the element portion 31 associated with secondary path $s_1$ to repel or block the bubbles at point F. As will be readily understood by those skilled in the art, the bubble domain propagation paths, e.g., primary path $p$, are defined by the magnetic poles which are sequentially formed in the presence of $H_r$ at the associated propagation elements 19, e.g., at points A, F, G, H, D, E. Because of the blocking pulse at point F, a bubble domain moving along primary path $p$ at point A is diverted to the magnetic pole formed by $H_r$ at point B, and enters secondary path $s_1$. The bubble domain continues around the secondary path $s_1$ under the influence of magnetic poles sequentially formed on the propagation elements 19 associated with the path, and exits the secondary path and re-enters the primary path via magnetic poles formed sequentially at points C, D and E.

If the data stream is not to be diverted into secondary path $s_1$, a steering current is pulsed through conductor pads C and 12 and thereby across element portion 31 to attract the bubble domains at point F. The bubble domains then traverse the magnetic pole sequence A, F, G, H, D, E and thereby continue propagation along the primary path p without being diverted into secondary path $s_1$.

Then, according to step two, each secondary path can be tested by using the detector D to compare the output and input data streams associated with each secondary path when the bubble domain stream is steered through that path.

After determining which ones of the secondary paths are good and which are bad, in step (3) element portions 31 and 32, or 31' and 32' are programmed to include or exclude the secondary paths from the primary path. The elements 19 and element portions 31, 32, 31' and 32' are typically formed from a soft magnetic, moderate resistivity material such as permalloy. Consequently, programming can be accomplished by passing a current through the appropriate element portion to destroy or degrade the magnetic properties of that portion. The programming current may destroy or degrade the magnetic properties of the element portion by: thermal annealing, in which the increased temperature resulting from resistive heating anneals the element portion; melting the element portion using resistive heating; and destroy the element portion using a very large, short duration current pulse to create a mechanical shock wave therein.

Referring further to FIGS. 2 and 3, to illustrate programming, again consider secondary path $s_1$. Secondary path $s_1$ can be programmed good (open), i.e., can be incorporated into the primary path by applying the programming current through pads 12 and C. This destroys or at least degrades the magnetic properties of the element portion 31 and thereby eliminates the magnetic pole at point F so that only path $s_{10}$ (FIG. 1) of the original alternatives $s_{10}$ and $s_{1c}$ (FIG. 1) is available to the bubble domains. Thereafter, the clockwise rotating, in-plane field $H_r$ propagates bubble domains from the junction 1 (FIG. 1) through path $s_1$ and then returns the domains to the primary path $p$.

However, if a secondary path is bad, it is bypassed (closed) by applying the programming current through the conductor pads which are adjacent to and on opposite sides of the secondary path. Thus, if path $s_1$ is bad, it can be closed by applying the programming current through pads 01 and 12, thereby permanently degrading the magnetic properties of the element portion 32. This eliminates the first pole of the secondary path $s_1$, i.e., the pole at point B, and forces the bubble domains to follow the alternative path $s_{1c}$ (FIG. 1) and remain in the primary path $p$.

By utilizing the overlay 18 which provides a primary path or loop and secondary path or loops associated therewith in series; by utilizing the conductor network 20 which cooperates with the overlay 18 to provide alternative paths for bubble domains at the junctions of the primary and secondary propagation paths; and by applying the method of programming of the present invention, there is provided a serial first in, first out organization for a bubble domain shift register so that defective segments thereof (secondary loops) can be eliminated without discarding the shift register chip.

Thus, there have been described a serial shift register organization and a method of programming the organization that provide increased capacity without decreasing the processing yield. An exemplary arrangement and other parameters have been described. However, the scope of the invention is limited only by the claims appended hereto and equivalents thereof. Other arrangements and parameters within the scope of the present invention will be readily derived by those skilled in the art. For example, instead of connecting each secondary loop directly to the primary loop, several such loops could be combined into an enlarged secondary loop using the same path of entrance to and egress from the primary loop.

Having thus described the preferred embodiment of the invention, what is claimed is:

1. A serial shift register comprising,
  a layer of magnetic material wherein single wall magnetic domains can be propagated,
  a propagation loop defined by magnetic poles formed sequentially in a magnetically soft, patterned overlay on the magnetic layer in the presence of a cyclically varying, in-plane magnetic field,
  at least one secondary propagation loop having ends for bubble domain entry and exit at points separated by at least one intervening magnetic pole of said propagation loop and defined by magnetic poles formed sequentially in said overlay in the presence of said cyclically varying in-plane magnetic field,
  said secondary propagation loop having a pair of first magnetic poles at said entry and exit, and having at least a second magnetic pole adjacent said entry; and
  a conductor network connected to said overlay for applying electric current to portions of said overlay to selectively degrade the magnetic properties thereof and thereby eliminate selected ones of said intervening magnetic poles and said second magnetic poles in order to provide a single continuous propagation path.

2. The serial shift register defined in claim 1, wherein said conductor network comprises:
  first and second conductors for establishing a current through said intervening magnetic pole; and
  a third conductor cooperating with one of said first and said second conductors for establishing a current through said second magnetic pole.

3. A method for forming a serial shift register having a layer of magnetic material wherein single wall magnetic domains may be propagated, comprising:
  forming on said layer a patterned arrangement of magnetically soft material suitable for providing shifting arrays of magnetic poles in a cyclically varying magnetic field in the plane of said arrangement such that a primary propagation loop and at least a secondary propagation loop are formed thereby such that portions of said patterned arrangement provide a pair of alternative paths for serially connecting said secondary propagation loop to said primary propagation loop or bypassing said secondary propagation loop;
  coupling a conductor network to said portions for selectively passing current through said portions associated with each one of said pair of alternative paths; and
  selectively passing electric current through said portions of sufficient magnitude to preclude the formation of magnetic poles thereby.

4. The method defined in claim 3, further comprising the step of testing the operability of said secondary loop for use in programming said organization to connect to or bypass said secondary propagation loop relative to said primary propagation loop.

5. A single wall magnetic domain organization, comprising:
  a layer of material in which single wall magnetic domains can be moved;
  a patterned arrangement of magnetically soft elements on said layer for controlling the movement of domains in said layer in the presence of an in-plane, varying magnetic field;
  said patterned arrangement comprising a primary path and at least one secondary path which is magnetically coupled to said first path by a junction including elements of said primary path and the respective secondary path; and
  electrical conductors coupled to said elements of said junction for selectively applying sufficient electrical current through one of the elements of said junction to degrade the operability of said element.

6. The organization recited in claim 5 wherein said primary path includes a plurality of similar magnetizable elements,
  said secondary path includes a plurality of similar magnetizable elements,
  said junction includes at least one element from each of said primary and secondary paths which elements are magnetically coupled to the other elements in the associated path whereby one of the paths is interrupted when the operability of an element is degraded but the other path is interconnected to form a continuous loop.

7. The organization recited in claim 5 wherein any secondary path is selectively and permanently decoupled from said primary path.

8. The organization recited in claim 5 wherein said electrical conductors include a plurality of conductors electrically connected to separate elements of said junction.

9. The organization recited in claim 8 including one conductor connected in common to each junction element in said primary path,
at least two conductors connected to each junction element in each said secondary path.

10. The organization recited in claim 9 wherein
at least one of said two conductors is connected to said junction element in a plurality of said secondary paths.

11. The organization recited in claim 10 wherein
at least one of said two conductors is further connected to the associated junction element in said primary path.

* * * * *